United States Patent [19]

Shida et al.

[11] Patent Number: 5,103,411
[45] Date of Patent: Apr. 7, 1992

[54] ELECTRONIC ODOMETER WHEREIN MEDIUM ORDER DIGIT DATA ADDRESSES LOCATIONS WHICH STORE HIGH AND LOW ORDER DIGIT DATA

[75] Inventors: Makoto Shida; Norio Seki, both of Niigata, Japan

[73] Assignee: Nippon Seiki Co., Ltd., Nagaoka, Japan

[21] Appl. No.: 505,071

[22] Filed: Apr. 5, 1990

[30] Foreign Application Priority Data

May 31, 1989 [JP] Japan .................. 1-137658

[51] Int. Cl.$^5$ ...................... G01C 21/00; G06F 11/00
[52] U.S. Cl. .................... 364/561; 371/37.9; 377/24.1; 360/6
[58] Field of Search ............. 364/561; 377/24.1, 24.2; 235/95 R; 371/37.9; 360/5, 6

[56] References Cited

U.S. PATENT DOCUMENTS

| | | | |
|---|---|---|---|
| 3,848,116 | 11/1974 | Möder et al. | 371/36 |
| 4,559,637 | 12/1985 | Weber | 377/24.1 |
| 4,616,312 | 10/1986 | Uebel | 371/36 X |
| 4,638,457 | 1/1987 | Schrenk | 377/24.1 X |
| 4,663,770 | 5/1987 | Murray et al. | 377/24.1 X |
| 4,682,287 | 7/1987 | Mizuno et al. | 364/561 |
| 4,757,522 | 7/1988 | Kieselstein | 377/26 |
| 4,803,646 | 2/1989 | Burke et al. | 377/24.1 X |
| 4,803,707 | 2/1989 | Cordan, Jr. | 379/24.1 |
| 4,807,264 | 2/1989 | Bauer | 377/24.1 |
| 4,891,812 | 1/1990 | Bocci et al. | 371/36 X |

FOREIGN PATENT DOCUMENTS

| | | |
|---|---|---|
| 3532768 | 9/1985 | Fed. Rep. of Germany . |
| 56-84512 | 7/1981 | Japan . |
| 56-154611 | 11/1981 | Japan . |
| 59-196414 | 11/1984 | Japan . |
| 62-201312 | 9/1987 | Japan . |
| 62-254013 | 11/1987 | Japan . |
| 63-40811 | 2/1988 | Japan . |

Primary Examiner—Joseph L. Dixon
Attorney, Agent, or Firm—Lowe, Price, Leblanc & Becker

[57] ABSTRACT

An electronic odometer is disclosed, in which, in order to provide higher reliability, integrated traveled distance data to be stored in a nonvolatile memory is divided into three portions, i.e., high order digit data, medium order digit data, and low order digit data. A plurality of memories constituting the nonvolatile memory having the digit representative of the medium order digit data as the address thereof or as a part of the address thereof are selected, and the high order digit data which is required to be the most reliable of the three portions is written into at least three of the selected memories. The low order digit data is written into at least one of the rest of the selected memories. When extracting the integrated traveled distance data from these memories, the high order digit data is determined by applying majority rule to the data read out from the three memories. It is thus achieved to enhance the reliability on the integrated traveled distance data by the application of majority rule.

23 Claims, 3 Drawing Sheets

ELECTRONIC ODOMETER WHEREIN MEDIUM ORDER DIGIT DATA ADDRESSES LOCATIONS WHICH STORE HIGH AND LOW ORDER DIGIT DATA

BACKGROUND OF THE INVENTION

1. Field of the Invention

The present invention relates to an electronic odometer mounted on a vehicle for writing and reading data of integrated distance traveled using an EEPROM.

2. Description of the Prior Art

An electronic type odometer indicating an integrated distance traveled by a vehicle is arranged such that signals from a traveled distance sensor capable of generating the signal representative of number of revolutions of a wheel shaft or the like are counted and the integrated traveled distance obtained from the number of counts is indicated on a suitable digital indicator. Since the odometer uses the battery of the vehicle as its power source, it is necessary to supply it with electricity at all times so that the data of the integrated traveled distance may not be lost even when power supply to the counter portion is removed due to exchange of the battery or such trouble as line breakage, or the data may not be lost when the main power supply to the vehicle is turned off. To meet this necessity, it is practiced to write data of integrated traveled distance into a nonvolatile memory.

Under the present situations, however, there is a limit to the number of times of writing into a nonvolatile memory. To cope with this problem, there have been proposed various means such as that disclosed in the gazette published by the Patent Office of Japan for Laid-open Patent Publication No. 56-84512 wherein a counted from a preset counter is stored in a nonvolatile memory at the time when power is turned off. When the operation is resumed, the data from the memory is preset in the counter. Japanese Laid-open Patent Publication No. 56-154611 teaches counting by a C-MOS counter wherein a plus 1 is written into a nonvolatile memory by a carry generator each time a carry is generated while keeping the C-MOS counter supplied with power at all times. Japenese Laid-open Patent Publication No. 59-196414 teaches having the data of the integrated traveled distance sequentially written into a plurality of nonvolatile memories thereby updating the data every time a predetermined distance has been traveled and, when the operation is resumed, having all the data in the plurality of nonvolatile memories read out and the maximum value of them selected.

In writing integrated traveled distance data into a nonvolatile memory, the number of times of writing for updating data in a nonvolatile memory is reduced by the above described prior art, but there still remains a point somewhat problematic as to the realiability on the data obtained at the time of resuming operation. That is, supposing erroneous data are written in the nonvolatile memory, determination whether some data is erroneous or not will become more reliable if sets of data sufficiently large in number are written in the memory. In this sense, the number of sets of data written in the memory in the above described prior art is considered insufficient.

Hence, an invention was made as disclosed in the gazette published by the Patent Office of Japan for Laid-open Patent Publication No. 62-201312, in which, when employing a nonvolatile memory, the memory address was used as a portion of the integrated traveled distance data, thereby achieving reduction in number of times of writing data into the nonvolatile memory and enhancement of reliability on the data.

SUMMARY OF THE INVENTION

In order to provide higher reliability than was obtained in the above described prior art, integrated traveled distance data to be stored in a nonvolatile memory is divided into three portions, i.e., high order digit data, medium order digit data, and low order digit data. A plurality of memories, constituting the nonvolatile memory, are selected using the digit representative of the medium order digit data as the address thereof or as a part of the address thereof. The high order digit data which is required to be the most reliable of the three portions are written into at least three of the selected memories. The low order digit data is written into at least one of the other selected memories. When extracting the integrated traveled distance data from these memories, the high order digit data is determined by applying majority rule to the data read out from the three memories. Thus, the present invention aims at enchancement of the reliability on the integrated traveled distance data by the application of majority rule.

DETAILED DESCRIPTION OF THE PREFERRED EMBODIMENTS

An embodiment of the present invention will be described below with reference to the accompanying drawings.

FIG. is a schematic block diagram showing the present invention. A traveled distance sensor 1 outputs a pulse signal every time the vehicle travels a predetermined distance. A CPU 2 causes a RAM 3 included therein to store the number of the pulse signals and every time value is increased by an amount corresponding to "1" km of traveled distance, for example , the CPU 2 alters the indicated value on the indicator display 4 by supplying it with an increment of "1" km, and at the same time, alters the value stored in an EEPROM 5 as a nonvolatile memory externally provided for the CPU 2 by supplying it with an increment of "1" km. The EEPROM 5 is provided so that, even when the data of traveled distance up to a point of time is erased from the RAM 3 during loss of power, for example, while exchanging the battery, the accurate data of traveled distance up to that point of time can always be restored by transferring the data from the EEPROM 5 to the RAM 3.

Figure 2:
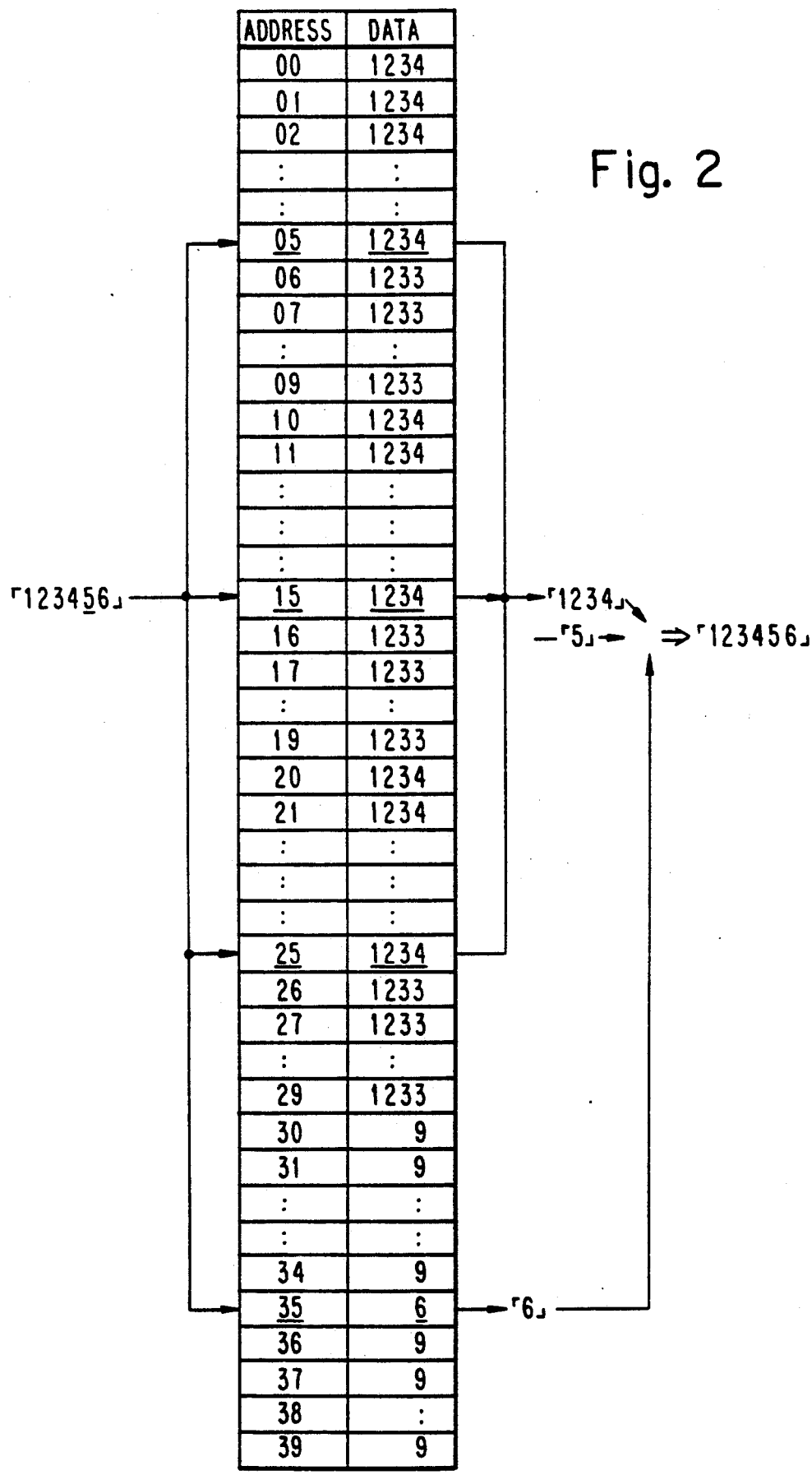
FIG. 2 is an explanatory diagram showing the relationship between memories and written data in an EEPROM in a first embodiment.

FIG. 2 is a drawing for explaining memory structure of the EEPROM 5 and writing operation for altering data therein in a first embodiment. The EEPROM 5 is comprised of a total of 40 memories at addresses from "00" to "39", each memory being formed of 16 14ts. The traveled distance data used in the present embodiment comprises six digits. The higher order four digits will be taken as "high order digit data", the lowest-order digit will be taken as "low order digit data", and the remaining one digit will be taken as "medium order digit data". For example, when "123456" km is used as one example of the distance data, "1234", "6", and "5" correspond to the high order digit, low order digit, and medium order digit data, respectively. Such division is determined based on reliability of data. More specifically, while a change of "1" made by mistake in the high order digit data means an error in units of at least "100" km, a change of "1" in the medium and low order digit data can be confined within an error in units of at most "10" km.

Then, a means must be devised to control occurrence of an error in altering the high order digit data. To improve the reliability on the data in the present embodiment, the high order digit data is written into memories at three addresses selected out of the addresses "00" to "29" using the medium order digit data as an address. The low order digit data is written into a memory at one address selected according to the medium order digit data out of the addresses "30" to "39". More specifically, since the medium order digit data is "5" in the data "123456" km, four addresses "05", "15", "25", and "35" are selected, and the addresses "05", "15", and "25" are used the high order digit data and the address "35" is used for the low order digit data.

Operation will be described below. The case where write operation is performed while the power is being normally supplied will be described first.

When the CPU 2 has counted the pulse signals from the traveled distance sensor 1 which corresponds to "1" km and alters the value in the RAM 3 from "123455" km to "123456" km, the data in the EEPROM 5 must also be altered from "123455" km to "123456" km. The CPU 2, first, reads the data in the RAM 3 and adds "1" km to the data "123455" km thereby altering it to "123456" km. The CPU 2 also divides data into the high order digit data constituted of four digits from the most significant digit, "1234", medium order digit data constituted of the fifth digit from the most significant digit, "5", and low order digit data constituted of the sixth digit from the most significant digit, "6". In the alteration of data at this time, the data which must be altered is only the sixth digit, "5", to be altered to "6". Hence, no alteration for the high order digit data is performed, but the low order digit data "6" is written into memory at the address "35" selected according to the medium order digit data, "5" thereby finishing the alteration.

In succession to the above described operation, the alteration from

| from | "123456" km |
|------|-------------|
|      | ↓           |
|      | "123457" km |
|      | ↓           |
|      | "123458" km |
|      | ↓           |
| to   | "123459" km | is effected only by changing the data in the memory at the address "35" in this way, "6"→"7"→"8"→"9".

Now, the case where the data is altered from "123459" km to "123460" km will be described.

The CPU 2, the same as before, divides the data "123460" km, obtained by adding "1" km to "123459" km, into the high order digit data constituted of four digits from the most significant digit, "1234", the medium order digit data constituted of the fifth digit from the most significant digit, "5 ", and the low order digit data constituted of the sixth digit from the most significant digit, "0". The low order digit data being "0" means that a carry to the medium order digit data has been generated. In fact, the medium order digit data is changed from "5" to "6". At this time, the CPU 2 selects addresses "06", "16", "26", and "36" anew according to the new medium order digit data "06", and writes the high order data "1234" into the addresses "06", "16", and "26" and the low order digit data "0" into the address "36" and thereby finishes the alteration.

Thus, relationships between the medium order digit data and the selected addresses become as shown below.

| Medium Order Digit Data | Selected Addresses | |
|---|---|---|
| | For High Order Digit | For Low Order Digit |
| "0" | "00", "10", "20" | "30" |
| "1" | "01", "11", "21" | "31" |
| "2" | "02", "12", "22" | "32" |
| . | . | . |
| . | . | . |
| "8" | "08", "18", "28" | "38" |
| "9" | "09", "19", "29" | "39" |

The medium order digit data is the data of the second digit from the least significant digit, namely, it is the data representing the tens digit, and therefore, it is altered with an increment of "1" for every 10 km, and it reverts to the same data after traveling of "100" km. This means that the same memories are selected again when a distance of "100" km is traveled. To be more specific, paying attention to one of the memories for the high order digit, the memory at the address "01", for example, it is only when the medium order digit data is altered from "0" to "1" that data is written into the address "01", and it is when a distance of "100" km has been traveled that the medium order digit data is altered again from "0" to "1". This means that writing into the memory for the high order digit data is executed once for each "100" km and, hence, $10^3$ times of writing is made therein while a distance of 100,000 km is traveled. This number of times is sufficiently small to meet the condition for the upper limit of the number of times for writing data into the EEPROM 5, $10^4$ times. As to the memory for the low order digit data, however, data is written therein at the rate of 10 times for each "100" km distance, and hence, writing is made $10^4$ times therein while the distance of 100,000 km is traveled. In this case, the condition for the upper limit is barely met.

Thus, while the power is being normally supplied, the data of integrated traveled distance is written into the EEPROM 5 without violating the condition for upper limit of the number of times of writing into the EEPROM 5.

When the power supply to the CPU 2 is temporarily stopped for such reason as exchanging the battery, the data stored in the RAM 3 within the CPU 2 becomes lost. As a measure to meet the situation, the latest data is read from the EEPROM 5 and the read data is transferred to the RAM 3. Through this process, the RAM 3 is enabled to restore the same data as stored therein before the data was lost.

Referring again to FIG. 2, the operation to read out data from the EEPROM 5 will be described below.

We suppose now that trouble as described above has occurred when the data in the RAM 3 is "123456" km. The contents in the memories of the EEPROM 5 at this time are the same as shown in FIG. 2. In order for the CPU 2 to read out the data "123456" km from the EEPROM 5, it must first search for the memory loaded with the latest data. The method for the searching is disclosed in the gazette published by the Patent Office of Japan for Laid-open Patent Publication No. 62-254013.

As shown in FIG. 2, the next higher values of data is stored in sucessively higher locations of the memory. As shown, the most recently loaded location will be the highest addressed location before a change to a lower value. In the example of FIG. 2, locations 00 to 05 store the high order data value "1234" and locations 06 to 09 store the next lower high order data value "1233". Similarly, locations 10 to 15 store the high order value "1234" while locations 16 to 19 store the next lower high order data value "1233"; and the locations 10 to 15 store the high order data value "1234" while locations 16 to 19 store the next lower high data value "1233". As shown in FIG. 2 a first change in the stored data value occurs at location 06, a second change in the stored data value occurs at the location 16, and a third change occurs at the location 26. The correct start point in each address range, i.e. the location most recently written into, is the location preceding the change point. In the example of FIG. 2, the most recently written high order locations therefore are 05, 15 and 25.

To recognize the correct start points, data values in different locations are compared sequentially to determine the change points, preferably in the manner disclosed in Japanese Patent Laying Open No. 62-254013. Having found the change point by such a comparative process, or similar search technique, the location having an address number one less than the change point will be selected as the locations most recently written.

When the addresses of the memories storing the latest data for the high order digit are found to be "05", "15", and "25" through the above mentioned searching method, the CPU 2 applies majority rule to "1234", "1234", and "1234" written in the three memories and determines the data "1234" as the high order digit data. As to the data of the medium order digit, it also applies majority rule to the lower order digits of the selected addresses "05", "15", and "25" and determines "5" as the medium order digit data. As to the low order digit data, the CPU 2 reads out "6" written in the memory at the address "35" according to the medium order digit data "5" and determines the data "6" as the low order digit data.

Even when the data at the address "05" is not "1234" but "1230", the data "1234" at the addresses "15" and "25" is preferentially taken up by majority rule and this data "1234" is determined to be the high order digit data.

When the CPU 2 in search for the address "05" has selected the address "06" by mistake, the data written at the address "6" is "1233". However, the same as described above, the data "1234" written at the addresses "15" and "25" is determined as the high order digit data. Also as to the medium order digit data, the lower order digit "5" of the addresses "15" and "25" is preferentially selected by majority rule and this data "5" is determined to be the medium order digit data.

Accordingly, the present embodiment has an effect that, when integrated traveled distance data are to be transferred from the EEPROM to the RAM 3, the high order digit data and medium order digit data requiring higher reliability are determined by majority rule, and therefore, even when the CPU 2 makes a malfunction or a certain error is included in the data in the EEPROM 5, accurate data of integrated traveled distance can be transferred to the RAM 3.

Figures 1, 3:
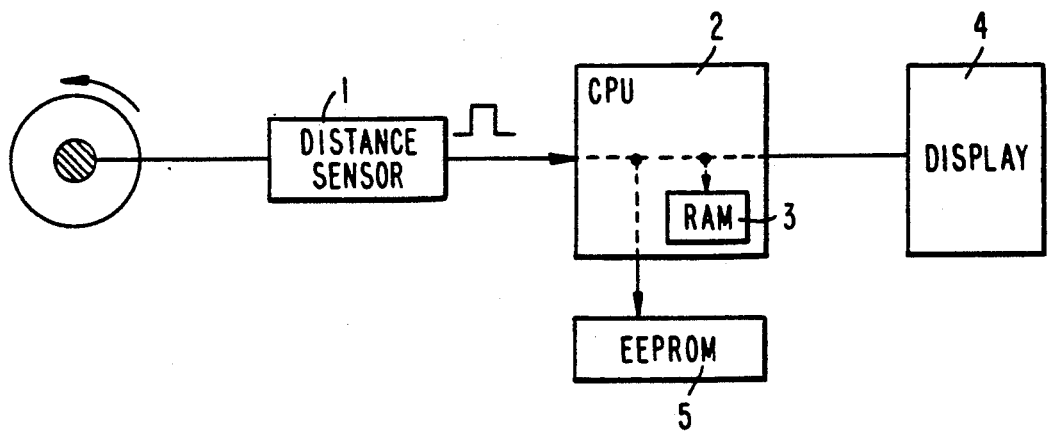
FIG. 1 is a schematic block diagram showing an electronic odometer.
FIG. 3 is an explanatory diagram showing relationship between memories and written data in an EEPROM in a second embodiment.

Referring now to FIG. 3, a second embodiment of the present invention will be described, but since it differs from the above described embodiment only in the method of writing the low order digit data, this part only will be described below.

The above described embodiment was such that only one set of the low order digit data is written in one of the memories at the addresses "30" to "39" allotted to the low order digit data. In the present embodiment, it is made possible to write three sets of data into one memory.

As shown in FIG. 3, three sets of data "6" for the low order digit are written in the memory at the address "35".

Therefore, when the integrated traveled distance data are transferred from the EEPROM 5 to the RAM 3, majority rule is applied not only to the high order digit data and medium order digit data, but also to the low order digit data, of which three sets of data are written in one memory. Accordingly, the reliability on the integrated traveled distance data can be enhanced.

Figure 4:
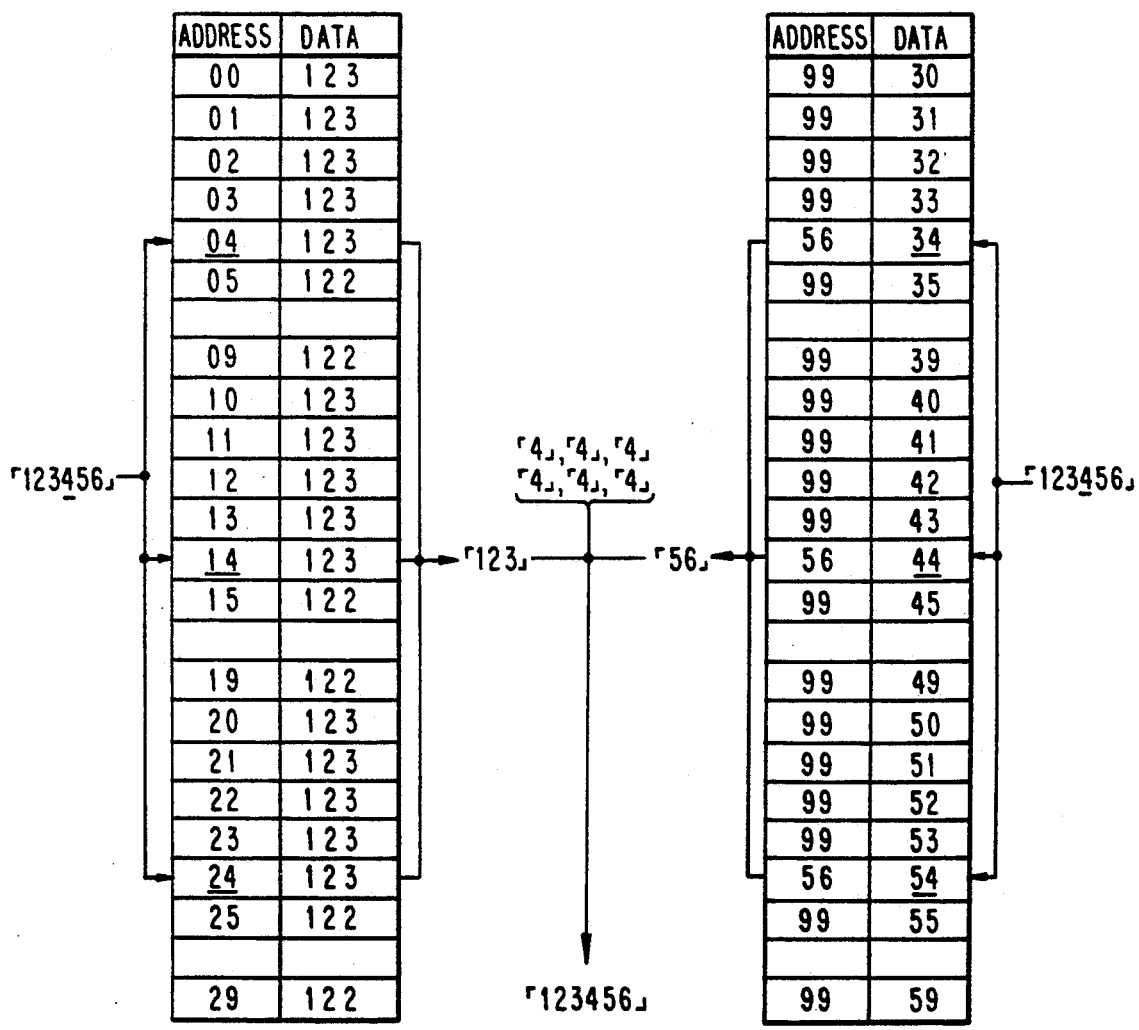
FIG. 4 is an explanatory diagram showing relationship between and written data in an EEPROM in a third embodiment.

FIG. 4 shows a third embodiment of the present invention.

The memory structure is such that there are set up totally 60 memories at addresses from "00" to "59" therein, each memory of those at the addresses from "00" to "29" is constituted of 12 bits for writing in high order digit data and each memory of those at the addresses from "30" to "59" is constituted of 8 bits for writing in low order digit data. Also in this embodiment, six-digit data is used for the integrated traveled distance data. When the data "123456" is again taken as a particular example, "123" corresponds to the high order digit data, "4" corresponds to the medium order digit data, and "56" corresponds to the low order digit data.

There are six memories which are selected according to the data of the medium order digits. The addresses of these memories are "04", "14", "24", "34", "44", and "54". In the memories at the addresses "04", "14", and "24", there is written the high order digit data "123", and in the memories at the addresses "34", "44", and "54", there is written the low order digit data "56".

As the integrated traveled distance data is increased, the data in the memories at the addresses "34", "44", and "54" is altered in increments of "1".

When such data is changed from "99" to "00", a carry is generated and the medium order digit data is also altered with an increment of "1". Thus, it is altered from "4" to "5", whereby memories at the addresses "05", "15", "25", "35", "45", and "55" are selected anew as the six memories. The high order digit data "123" and the low order digit data "00" are written into the newly selected memories, followed by similar operations. The memories at the addresses "34", "44", and "54" in which the data have been altered at every increase of "1" km will not be written in, with data therein remaining "99", until a distance of "100" km is traveled and the medium order digit becomes "4" again. It is after a distance of "1000" km has been traveled that the memories at the addresses "04", "14", and "24" are written in again.

Therefore, during the period that a distance of 100,000 km is traveled, the memories at the addresses "00" to "29" are each written in $10^3$ times, and the memories at the addresses "30" to "59" are each written in $10^4$ times. Each of which meets the condition for uppper limit of the times of writing into the EEPROM 5.

When it becomes necessary to read out the data of integrated traveled distance from the EEPROM 5 for some trouble as described before, supposing that the contents of the memories at that time are the same as shown in FIG. 4, the CPU 2 searches for the six memories in which the latest data are written and picks out those at the addresses "04", "14", "34","44", and "54", and then reads out data "123", "123", and "123" from the former three memories and determines the high order digit data to be "123" by majority rule. Similarly, data "56", "56", and "56" are read out from the latter three memories and the low order digit data is determined to be "56" by majority rule. For the medium order digit data, by suitably selecting five addresses from the addresses of the six memories and applying majority rule to the lower digit of the addresses, it is enabled to determine the medium order digit data to be "4".

Also in this embodiment, the reliability on the integrated traveled distance data read out from the EEPROM 5 can be enhanced.

The present invention has other applications than those in the above described embodiments. For example, when the integrated traveled distance data is indicated to the decimal fraction, integer digits may be taken as the high order digit data and the decimal fraction portion may be taken as the low order digit data.

Such a memory structure may also be made which has memories set up at addresses from "00" to "99", in which high order digit data is written into memories at corresponding seven addresses picked out of those from "00" to "69" and low order digit data is written into memories at corresponding three addresses picked out of those from "70" to "99", the high order digit data is determined by majority rule applied to data from the seven addresses and the low order digit data is determined by majority rule applied to data from the three addresses, and the integrated traveled distance data read out in accordance with the determined data is displayed on the indicator 4.

What is claimed is:

1. In an electronic odometer which stores integrated traveled distance data of a vehicle in an EEPROM, the improvement comprising:
   means for dividing said data into high order digit data, medium order digit data, and low order digit data;
   means for selecting at least four memories out of memories constituting said EEPROM;
   means for writing the high order digit data into at least three of said selected memories and writing the low order digit data into at least one other of said selected memories;
   reading means for
   (i) reading out data from said at least three memories with the high order digit data written therein and determining a value of the high order digit data by applying majority rule to the data read from said at least three memories,
   (ii) reading out data from said at least one memory with the low order digit data written therein and determining a value of the low order digit data, and
   (iii) reading out addresses of at least three of said selected memories and determining a value of the medium order digit data by applying majority rule to the read addresses at the time of reading; and
   means for determining the data of integrated traveled distance from the thus determined values of high order digit data, medium order digit data, and low order digit data.

2. An improvement in an electronic odometer according to claim 1, wherein said low order digit data is written in the form of at least three sets of data into at least one selected memory, and the value of the low order digit data is determined at the time of reading by applying a majority rule to said at least three sets of data written in said at least one memory.

3. An improvement in an electronic odometer according to claim 1, wherein, at the time of writing of said low order digit data, one set of said data is written into at least one selected memory.

4. An improvement in an odometer according to claim 1, wherein the means for writing use a current value of the medium order digit data to determine addresses for selecting at least three of said selected memories in which to write the high order digit data.

5. An improvement in an odometer according to claim 1, wherein the means for writing use a current value of the medium order digit data to determine an address for selecting said at least one of said selected memories in which to write the low order digit data.

6. An improvement in an odometer according to claim 1, wherein the means for writing use a current value of the medium order digit data to determine addresses for selecting at least three of said selected memories in which to write the low order digit data.

7. An improvement in an odometer according to claim 1, wherein more than four memories constitute said EEPROM, and the reading means select said at least three memories with the high order digit written therein by determining which memories of said EEPROM were most recently written with high order digit data.

8. A method of retrieving odometer data from a nonvolatile memory having a plurality of memory locations storing high order digit data and a plurality a memory locations storing low order digit data, said method comprising the steps of:
   selecting at least three locations which have been most recently written into from among the plurality of memory locations which store high order digit data;

reading data from the selected at least locations and determining a value of high order digit data from the data read from said selected at least three locations;

using the addresses of said selected at least three locations to determine a value of medium order digit data;

using the value of medium order digit data to form an address for low order digit data;

reading data from the memory location indicated by said address for low order digit data and determining a value of low order digit data from the data read from the memory location indicated by said address for low order digit data; and determining a value of integrated traveled distance from the values of high, medium and low order digit data.

9. A method of retrieving odometer data as in claim 8, wherein the determining of a value of high order digit data is performed by applying majority rule to the data read from the selected at least three locations.

10. A method of retrieving odometer data as in claim 8, wherein the determining of a value of medium order digit data is performed by applying majority rule to the addreasses of the selected at least three locations.

11. A method of retrieving odometer data as in claim 8, wherein said memory location indicated by said address for low order digit data stores three sets of low order digit data and the determining of a value of low order digit data is performed by applying majority rule to the three sets of digit data read from the memory location indicated by said address for low order digit data.

12. A method of retrieving odometer data from a nonvolatile memory having a plurality of memory locations storing high order digit data and a plurality of memory locations storing low order digit data, said method comprising the steps of:

selecting at least three locations which have been most recently written into from among the plurality of memory locations which store high order digit data;

reading data from the selected at least three high order locations and determining a value of high order digit data from the data read from said selected at least three locations;

selecting at least three locations which have been most recently written into from among the plurality of memory locations which store low order digit data;

reading data from the selected at least three low order locations and determining a value of low order digit data from the data read from said selected at least three locations;

using a plurality of the addresses of said selected at least three high order locations and said selected at least three low order location to determine a value of medium order digit data;

determining a value of integrated traveled distance from the values of high, medium and low order digit data.

13. A method of retrieving odometer data as in claim 12, wherein the determining of a value of high order digit data is performed by applying majority rule to the data read from the selected at least three high order locations.

14. A method of retrieving odometer data as in claim 12, wherein the determining of a value of low order digit data is performed by applying majority rule to the data read from the selected at least three low order locations.

15. A method of retrieving odometer data as in claim 12, wherein the determining of a value of medium order digit data is performed by applying majority rule to the addresses of the selected at least three high order locations and at least two of the addresses of the selected at least three low order locations.

16. A method of retrieving odometer data as in claim 12, wherein the determining of a value of medium order digit data is performed by applying majority rule to addresses of the selected at least three addresses among said three high order locations and at least three low order locations.

17. A method of writing odometer data into a non-volatile memory, said method comprising steps of:

dividing a current value of traveled distance measured by an odometer into values of high, medium and low order digit data;

using the value of the medium order digit data to form at least three high order addresses;

storing the value of high order digit data in at least three locations in said non-volatile memory indicated by said at least three high order addresses;

using the value of the medium order digit data to form at least one low order address;

storing the value of low order digit data in at least one location in said non-volatile memory indicated by said at least one low order address.

18. A method of writing odometer data into a non-volatile memory as in claim 17, wherein said value of medium order digit data is not stored in said non-volatile memory.

19. A method of writing odometer data into a non-volatile memory as in claim 17, wherein the step of storing the value of low order digit data in at least one location comprising storing said value of low order digit data three times are three identical digit values in said at least one location in said non-volatile memory indicated by said at least one low order address.

20. A method of writing odometer data into a non-volatile memory as in claim 17, wherein the step of using the value of the medium order digit data to form at least one low order address forms three low order addresses; and the step of storing the value of low order digit data stores the low order digit data in three locations in said non-volatile memory indicated by said three low order addresses.

21. A method of storage and retrieval of odometer data in a non-volatile memory comprising the steps of:

(A) storing a current value of traveled distance measured by an odometer in said non-volatile memory by (1) dividing the current value of traveled distance into values of high, medium and low order digit data;

(2) using the value of the medium order digit data to form at least three high order addresses;

(3) storing the value of high order digit data in at least three locations in said non-volatile memory indicated by said at least three high order addresses;

(4) using the value of the medium order digit data to form at least one low order address; and (5) storing the value of low order digit data in at least one location in said non-volatile memory indicated by said at least one low order address; and (B) retrieving a value of traveled distance data in said non-volatile memory by
  (1) selecting at least three locations in non-volatile memory which have been most recently written into;
  (2) reading data from the selected at least three locations and determining a value of high order digit data from the data read from said selected at least three locations;
  (3) using the addresses of said selected at least three locations to determine a value of medium order digit data;
  (4) reading low order digit data from another memory location and determining a value of low order digit data from the data read from the memory location indicated by said address for low order digit data; and
  (5) determining a value of integrated traveled distance from the determined values of high, medium and low order digit data.

22. A method of storage and retrieval of odometer data in a non-volatile memory as in claim 21, further comprising the step of
  using the value of medium order digit data to form an address for low order digit data; wherein
  the step of reading low order digit data reads data from the memory location indicated by said address for low order digit data.

23. A method of storage and retrieval of odometer data in a non-volatile memory as in claim 21, further comprising the step of
  selecting at least three additional locations in said non-volatile memory which have been most recently written into from among the plurality of memory locations; wherein
  the step of reading low order digit data reads data from the selected at least three additional locations and the determining of a value of low order digit data uses the data read from said selected at least three additional locations.

* * * * *